(12) United States Patent
Han

(10) Patent No.: US 7,312,147 B2
(45) Date of Patent: Dec. 25, 2007

(54) METHOD OF FORMING BARRIER METAL IN SEMICONDUCTOR DEVICE

(75) Inventor: Jae Won Han, Bucheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 160 days.

(21) Appl. No.: 11/024,795

(22) Filed: Dec. 30, 2004

(65) Prior Publication Data

US 2005/0142858 A1   Jun. 30, 2005

(30) Foreign Application Priority Data

Dec. 30, 2003   (KR)  ............... 10-2003-0100385

(51) Int. Cl.
*H01L 21/4763* (2006.01)
(52) U.S. Cl. ............... 438/643; 438/618; 438/637
(58) Field of Classification Search ............... 438/637, 438/643, 618
See application file for complete search history.

(56) References Cited

U.S. PATENT DOCUMENTS

| 2003/0073314 A1* | 4/2003 | Skinner et al. ............. 438/689 |
| 2004/0087137 A1* | 5/2004 | Takewaka et al. .......... 438/633 |
| 2005/0255700 A1* | 11/2005 | Gopalraja et al. .......... 438/687 |

* cited by examiner

*Primary Examiner*—Thao P. Le
(74) *Attorney, Agent, or Firm*—Lowe Hauptman Ham & Berner LLP

(57) ABSTRACT

A method of forming a barrier metal in a semiconductor device. The present invention includes forming an insulating layer on a substrate having a lower metal line formed thereon, forming an opening exposing the lower metal line through the insulating layer, and forming a barrier metal layer on a sidewall of the opening and the insulating layer except the lower metal line by applying a positive voltage to the substrate.

20 Claims, 6 Drawing Sheets

METHOD OF FORMING BARRIER METAL IN SEMICONDUCTOR DEVICE

CROSS-REFERENCES TO RELATED APPLICATIONS

This application claims the benefit of Korean Patent Application No. 10-2003-0100385, filed on 30 Dec. 2003, which is hereby incorporated by reference as if fully set forth herein.

BACKGROUND OF THE INVENTION

1. Field of the Invention

The present invention relates to semiconductor device manufacturing and, more specifically, to a method of forming a barrier metal in a semiconductor device.

2. Discussion of the Related Art

Generally, a line width is still decreasing according to a highly increasing degree of integration in semiconductor devices. A microscopic line of a semiconductor device raises line resistance and delays a signal transfer. A single layer line structure has been replaced by a multi-layer line structure to solve the signal transfer delay problem.

Yet, as a distance between the lines in the multi-layer line structure is shortened, parasitic capacitance between the lines of the same layer increases to worsen the signal transfer delay in a semiconductor device. Specifically, in the case of a line having a microscopic line width, the signal transfer delay attributed to the parasitic capacitance of the line considerably affects the operational characteristics of the semiconductor device. To lower the parasitic capacitance between lines, a thickness of the line is lowered and an insulating interlayer is thickened. Hence, the line is formed of a line material having low specific resistance and the insulating interlayer is formed of a material having a low dielectric constant. For this, Cu is recommended as the line material and various materials are proposed as the material of the insulating interlayer. Yet, in case of Cu, dry etching has difficulty due to etch byproducts usually having a low vapor pressure.

To overcome such a problem, a via hole or a via hole and trench are formed in an insulating interlayer, the via or the via and trench are filled up with Cu, and planarization is then carried out. This is called a damascene or dual damascene process.

FIGS. 1A to 1E are cross-sectional diagrams for explaining a dual damascene process by 'via first' according to a related art.

Referring to FIG. 1A, a first insulating interlayer 102 is deposited on a semiconductor substrate 101 previously provided with a lower line and the like.

An etch-stop layer 103 is formed on the first insulating interlayer 102 using silicon nitride or the like.

And, a second insulating interlayer 104 having a low dielectric constant is deposited on the etch-stop layer 103.

Photoresist is coated on the second insulating interlayer 104 and is then selectively patterned to form a first photoresist pattern 105 exposing the second insulating interlayer 104 corresponding to a via hole area.

Referring to FIG. 1B, the exposed second insulating interlayer 104 is etched using the first photoresist pattern 105 as an etch mask. If the etch-stop layer 103 is exposed, the etch process keeps being carried out on the exposed etch-stop layer 103 and the first insulating interlayer 102 to complete a via hole 106.

Referring to FIG. 1C, after the first photoresist pattern has been removed, photoresist is coated over the substrate 101 including the second insulating interlayer 104. Exposure and development are selectively carried out on the photoresist to form a second photoresist pattern 107 exposing the second insulating interlayer 104 corresponding to a trench area.

Referring to FIG. 1D, the exposed second insulating interlayer 104 is etched using the second photoresist layer 107 as an etch mask to form a trench 108.

Referring to FIG. 1E, after the second photoresist pattern has been removed, a barrier metal layer 109 is formed to a prescribed thickness on insides of the via hole and trench.

Subsequently, a metal layer 110, e.g., a copper layer, is formed to fill up the via hole and trench.

The Cu metal layer 110 and the barrier metal layer 109 are planarized until the second insulating interlayer 104 is exposed to form a plug and upper metal line within the via hole and trench. Thus, the related art dual damascene process is completed.

Yet, in the related art semiconductor device structure, the barrier metal layer that is different from the metal lines is inserted between the upper and lower metal lines, thereby raising the resistance of the semiconductor device.

To overcome the raised resistance problem, a method according to another related art is proposed as follows.

First of all, a barrier metal layer is deposited in a via hole and trench. And, the barrier metal layer contacting with a lower metal line is then etched by plasma dry etch to expose the lower metal line.

However, the method according to another related art needs the additional etch step, thereby having difficulty in process reproducibility and optimal process condition setup.

And, the method according to another related art has difficulty in raising efficiency due to an increasing overall process time.

Moreover, in the method according to another related art, the structure in the vicinity of the barrier metal layer is damaged by plasma to lower device reliability.

SUMMARY OF THE INVENTION

Accordingly, the present invention is directed to a method of forming a barrier metal in a semiconductor device that substantially obviates one or more problems due to limitations and disadvantages of the related art.

The present invention advantageously provides a method of forming a barrier metal in a semiconductor device, by which a barrier metal layer is prevented from contacting with a lower metal line exposed via a via hole without additional etch in forming the barrier metal layer in the via hole and trench exposing the lower metal line.

Additional advantages, objects, and features of the invention will be set forth in part in the description which follows and in part will become apparent to those having ordinary skill in the art upon examination of the following. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method of forming barrier metal in a semiconductor device according to the present invention includes the steps of forming an insulating layer on a substrate having a lower metal line formed thereon, forming an opening exposing the lower metal line through the insulating layer, and forming a barrier metal layer on a sidewall of the opening and the insulating layer except the lower metal line by applying a positive voltage to the substrate.

Preferably, the opening comprises a via hole and a trench.

Preferably, the barrier metal layer is a single layer formed of either Ta or Ti or a double layer formed of Ti/TiN or Ta/TiN.

Preferably, the barrier metal layer is formed by either ionized metal plasma physical vapor deposition or collimator sputtering.

Preferably, the barrier metal layer is formed by plasma enhanced metal organic chemical vapor deposition.

Preferably, the positive voltage is applied to the substrate in a manner of applying the positive voltage to a wafer chuck having the substrate loaded thereon.

More preferably, the voltage applied to the wafer chuck is about 1 to about 90 eV per unit area.

The present invention is characterized in that positive metal particles avoid being deposited on a metal line surface using an electrostatic repulsive force in a manner of applying a positive voltage to a wafer chuck receiving a semiconductor substrate thereon in depositing a barrier metal layer to induce an electrically negative state on a lower part of an insulating interlayer in the vicinity of a metal line by polarization.

Therefore, the present invention avoids an additional process for removing the barrier metal layer formed on the lower metal line surface in the via hole to lower contact resistance of the metal line.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Prior to describing the present invention, the dual damascene process is categorized into a via first type, a trench first type, and a self-aligned type.

The via first type dual damascene process includes the steps of forming a via hole by etching an insulating interlayer and forming a trench on the via hole by etching the insulating interlayer again. The trench first type dual damascene process includes the step of sequentially forming a trench and a via hole. And, the self-aligned type dual damascene process includes the steps of simultaneously forming both a trench and a via hole by aligning a via hole area under a trench area.

For convenience of explanation, a method of forming a barrier metal layer according to the present invention will be described with reference to the via first type dual damascene process. Of course, the present invention is applicable to the other types of the dual damascene process as well.

FIGS. 2A to 2E are cross-sectional diagrams for explaining a method of forming a barrier metal layer according to the present invention.

Figure 1A:
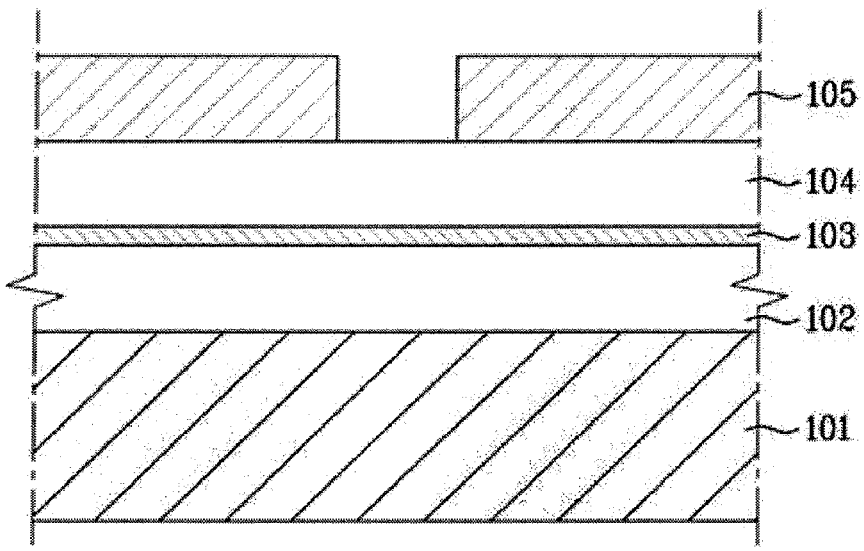
FIGS. 1A to 1E are cross-sectional diagrams for explaining a dual damascene process by "via first" according to a related art.
Figure 1B:
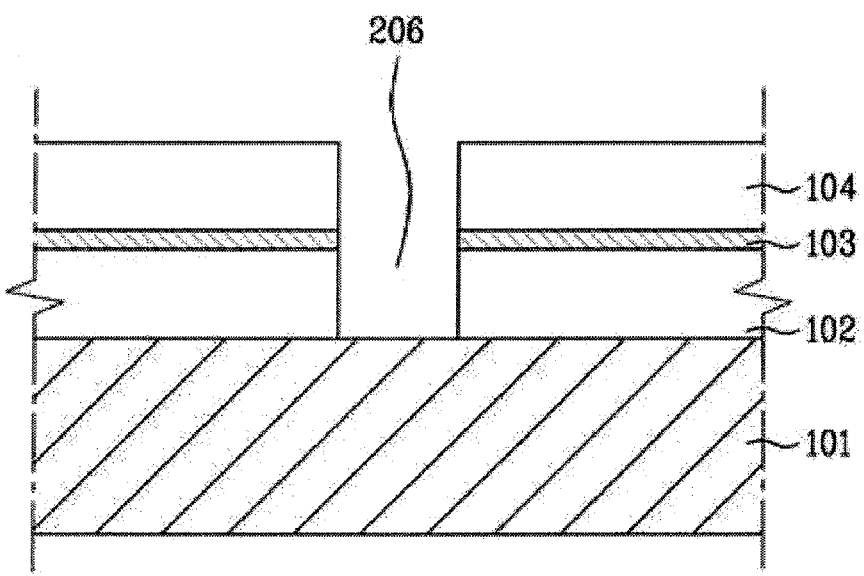
Figure 1C:
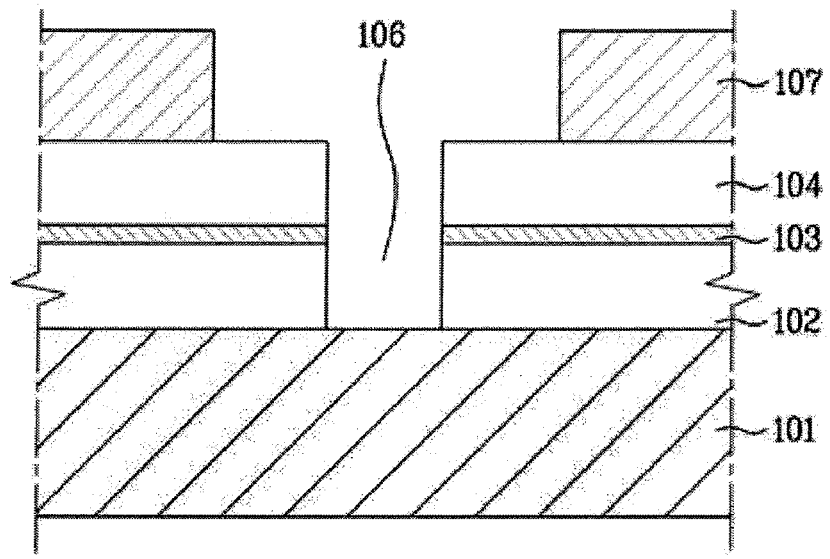
Figure 1D:
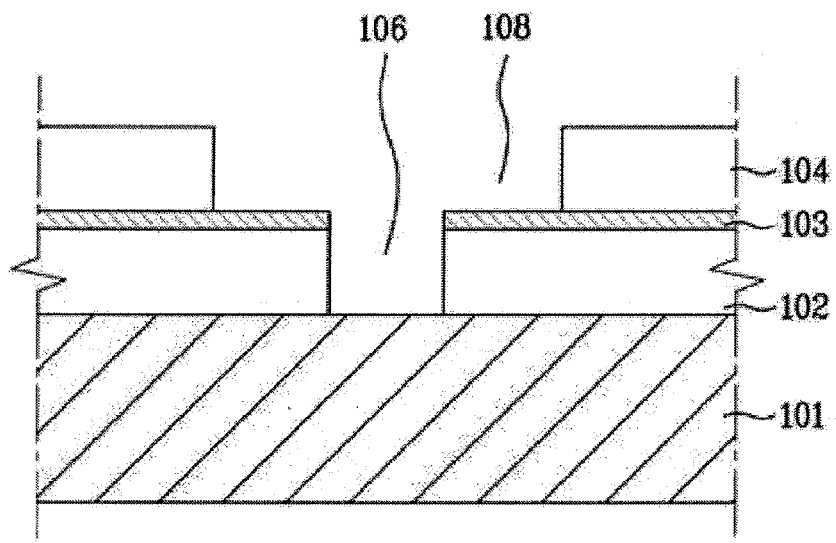
Figure 1E:
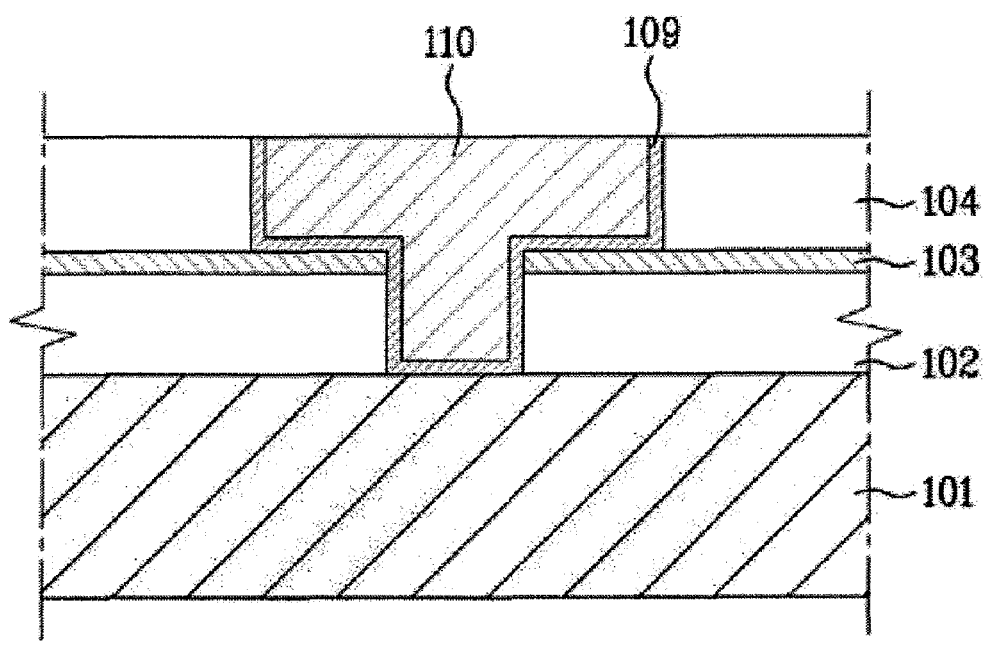
Figure 2A:
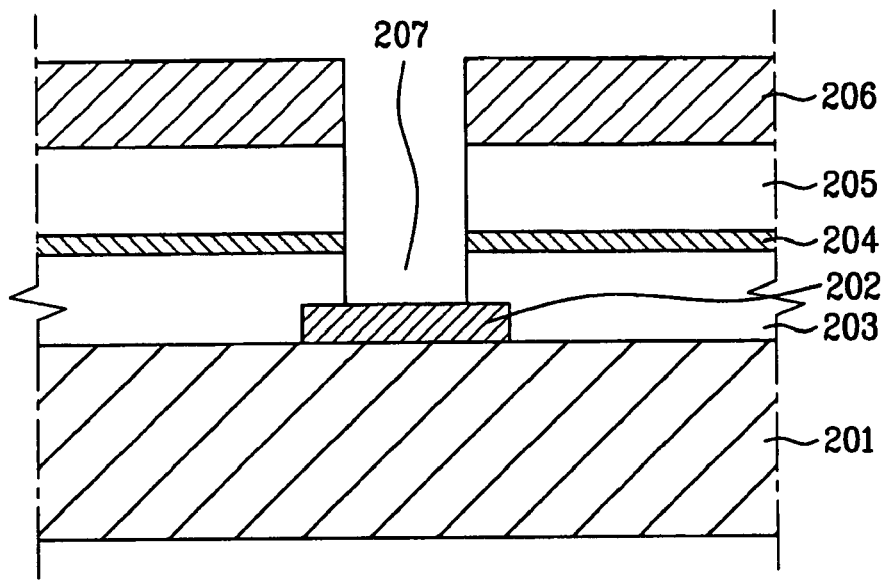
FIGS. 2A to 2E are cross-sectional diagrams for explaining a method of forming a barrier metal layer according to the present invention.

Referring to FIG. 2A, a metal layer, e.g., a Cu layer, is deposited on a semiconductor substrate 201 and is then selectively patterned to form a lower metal line 202. Of course, various devices such as a transistor, a capacitor, a device isolation layer and the like were previously formed on the semiconductor substrate 201.

Subsequently, a first insulating interlayer 203 is deposited on the semiconductor substrate 201 including the lower metal line 202. In doing so, the first insulating interlayer 203 can be formed using various materials. Specifically, the first insulating interlayer 203 is formed of TEOS series oxide such as LP-TEOS (low pressure tetraethylorthosilicate), $O_3$-TEOS, d-TEOS, and the like, FSG (fluorine silicate glass) deposited by high density plasma chemical vapor deposition, USG (undoped silicate glass), $SiH_4$, or BPSG.

An etch-stop layer 204 is formed on the first insulating interlayer 203 using silicon nitride or the like.

And, a second insulating interlayer 205 having a low dielectric constant is deposited on the etch-stop layer 204. In doing so, the second insulating interlayer 205 can be formed using one of the materials used for forming the first insulating interlayer 203.

Photoresist is coated on the second insulating interlayer 205 and is then selectively patterned to form a first photoresist pattern 206 exposing the second insulating interlayer 205 corresponding to a via hole area.

Subsequently, the exposed second insulating interlayer 205 is etched using the first photoresist pattern 206 as an etch mask. If the etch-stop layer 204 is exposed, the etch process keeps being carried out on the exposed etch-stop layer 204 and the first insulating interlayer 203 to complete a via hole 207.

Figure 2B:
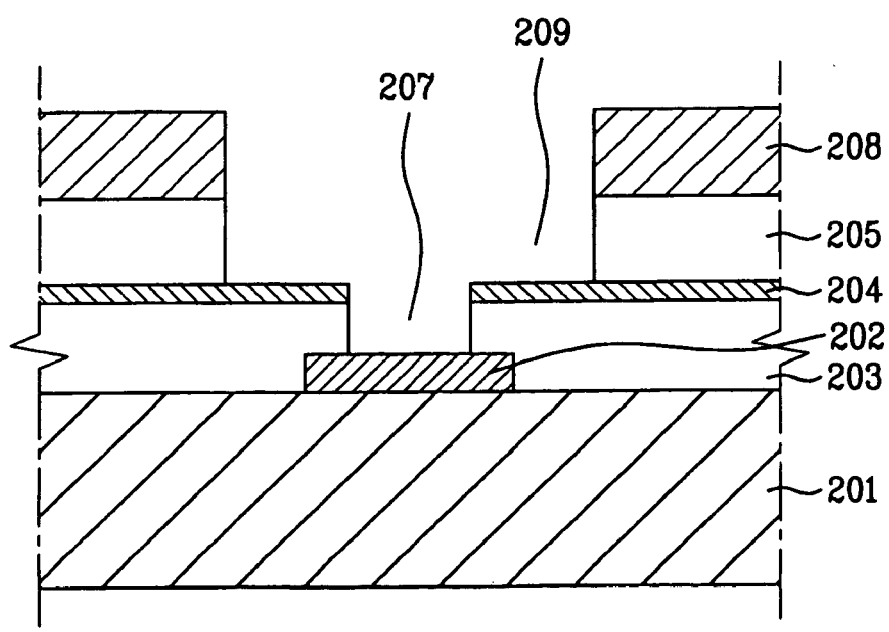

Referring to FIG. 2B, after the first photoresist pattern has been removed, photoresist is coated over the substrate 201 including the second insulating interlayer 205. Exposure and development are selectively carried out on the photoresist to form a second photoresist pattern 208 exposing the second insulating interlayer 205 corresponding to a trench area.

The exposed second insulating interlayer 205 is then etched using the second photoresist layer 208 as an etch mask to form a trench 209.

Meanwhile, the barrier metal layer is formed of a single layer of Ta, Ti, or the like or a double layer of Ti/TiN or Ta/TaN. The barrier metal layer is formed by sputtering or chemical vapor deposition (CVD), which is performed within a prescribed process chamber. Basically, sputtering or CVD is carried out while the semiconductor substrate 201 is loaded on a wafer chuck installed within the chamber. Generally, the wafer chuck employs an electrostatic chuck to electrically fix the semiconductor substrate 201 thereto.

The barrier metal layer forming process is explained in detail as follows.

Figure 2C:
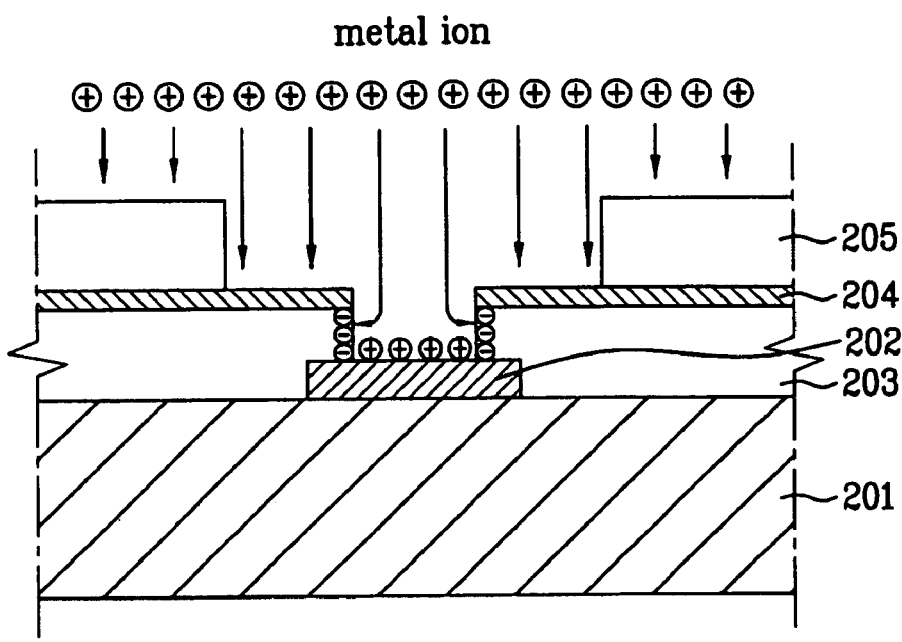

Referring to FIG. 2C, after the second photoresist pattern has been removed, a barrier metal layer 210 is formed by physical vapor deposition (PVD) such as ionized metal plasma PVD and collimator sputtering or CVD such as MOCVD (metal organic CVD).

In doing so, as mentioned in the foregoing description, the semiconductor substrate 201 is loaded on a wafer chuck, e.g., an electrostatic chuck. In depositing the barrier metal layer 210, a positive voltage of about 1 to about 90 eV per unit area is applied to the wafer chuck to impress a positive voltage to a surface of the substrate 201. Since the lower metal line 202 is exposed via the first and second insulating layers 203 and 205 stacked on the semiconductor substrate 201, a surface of the exposed lower metal line 202 is electrically positive. Simultaneously, as the surface of the exposed lower metal line 202 becomes electrically positive, a lower part of the first insulating interlayer 203 in the vicinity of the lower metal line 202 becomes electrically negative due to polarization and the rest portion of the first insulating interlayer 203 and a surface of the second insulating interlayer 205 becomes electrically neutral.

Figure 2D:
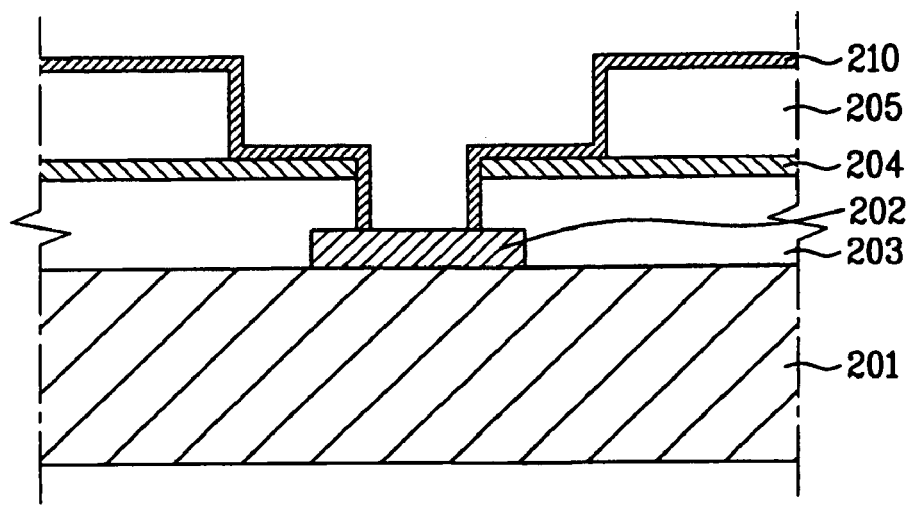

Meanwhile, metal particles deposited on the substrate 201 in sputtering are positively ionized to be attracted to the electrically negative or neutral first and second insulating interlayers 203 and 205 only instead of being deposited on the electrically positive surface of the lower metal line 202 due to an electrostatic repulsive force. Hence, the barrier metal layer 210, as shown in FIG. 2D, is deposited on a sidewall and bottom of the trench and a sidewall of the via hole only. Alternatively, in case of using CVD instead of sputtering, the metal particles can become electrically positive by applying plasma within the process chamber (plasma enhanced CVD). Hence, the barrier metal layer 210, as shown in FIG. 2D, is deposited on a sidewall and bottom of the trench and a sidewall of the via hole only.

The barrier metal layer (210) forming method can be applied to the barrier metal layer formed of the single layer of Ta, Ti, or the like or the double layer of Ti/TiN or Ta/TaN. Besides, the barrier metal layer forming method is also applicable to not only a damascene process of forming a via hole only but also all kinds of openings having the barrier metal layer 210 formed therein.

Figure 2E:
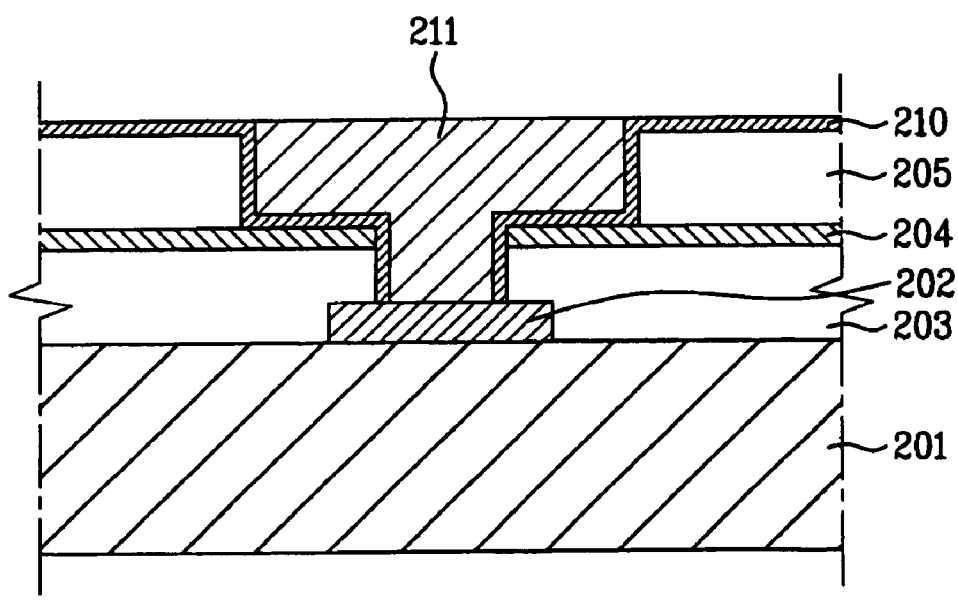

Referring to FIG. 2E, a metal layer 211, e.g., a copper layer, is formed to fill up the via hole and trench.

The Cu metal layer 211 and the barrier metal layer 210 on the second insulating interlayer 205 are planarized by CMP (chemical mechanical polishing) or the like until the second insulating interlayer 205 is exposed to form a plug and upper metal line within the via hole and trench. Thus, the method of forming the barrier metal layer 210 according to the present invention is completed.

Accordingly, the present invention prevents positive metal particles from being deposited on a metal line surface using an electrostatic repulsive force in a manner of applying a positive voltage to a wafer chuck receiving a semiconductor substrate thereon in depositing a barrier metal layer to induce an electrically negative state on a lower part of an insulating interlayer in the vicinity of a metal line by polarization.

Therefore, the present invention avoids an additional process for removing the barrier metal layer formed on the lower metal line surface in the via hole to lower contact resistance of the metal line.

Korean Application No. P2003-0100385 filed on Dec. 30, 2003, is hereby incorporated by reference in its entirety.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of forming barrier metal in a semiconductor device, comprising the steps of: forming an insulating layer on a substrate having a lower metal line formed thereon; forming an opening exposing the lower metal line through the insulating layer; and forming a barrier metal layer on a sidewall of the opening and the insulating layer except the lower metal line by applying a positive voltage to the substrate.

2. The method of claim 1, wherein the opening comprises a via hole and a trench.

3. The method of claim 1, wherein the barrier metal layer is a single layer formed of Ta.

4. The method of claim 1, wherein the barrier metal layer is a single layer formed of Ti.

5. The method of claim 1, wherein the barrier metal layer is a double layer formed of Ti/TiN.

6. The method of claim 1, wherein the barrier metal layer is a double layer formed of Ta/TiN.

7. The method of claim 1, wherein the barrier metal layer is formed by ionized metal plasma physical vapor deposition.

8. The method of claim 1, wherein the barrier metal layer is formed by collimator sputtering.

9. The method of claim 1, wherein the barrier metal layer is formed by plasma enhanced metal organic chemical vapor deposition.

10. The method of claim 1, wherein the positive voltage is applied to the substrate in a manner of applying the positive voltage to a wafer chuck having the substrate loaded thereon.

11. The method of claim 10, wherein the voltage applied to the wafer chuck is about 1 to about 90 eV per unit area.

12. A method for forming barrier metal in a semiconductor device, comprising: a step for forming an insulating layer on a substrate having a lower metal line formed thereon; a step for forming an opening exposing the lower metal line through the insulating layer; and a step for forming a barrier metal layer on a sidewall of the opening and the insulating layer except the lower metal line by applying a positive voltage to the substrate.

13. The method of claim 12, wherein the opening comprises a via hole and a trench.

14. The method of claim 12, wherein the barrier metal layer is a single layer formed of Ta or Ti.

15. The method of claim 12, wherein the barrier metal layer is a double layer formed of Ti/TiN or Ta/TiN.

16. The method of claim 12, wherein the barrier metal layer is formed by ionized metal plasma physical vapor deposition.

17. The method of claim 12, wherein the barrier metal layer is formed by collimator sputtering.

18. The method of claim 12, wherein the barrier metal layer is formed by plasma enhanced metal organic chemical vapor deposition.

19. The method of claim 12, wherein the positive voltage is applied to the substrate in a manner of applying the positive voltage to a wafer chuck having the substrate loaded thereon.

20. The method of claim 19, wherein the voltage applied to the wafer chuck is about 1 to about 90 eV per unit area.

* * * * *